(12) United States Patent
Herrick et al.

(10) Patent No.: US 7,670,045 B2
(45) Date of Patent: Mar. 2, 2010

(54) MICROSTRIP POWER SENSOR

(75) Inventors: Katherine J. Herrick, Chelmsford, MA (US); John P. Bettencourt, Danvers, MA (US); Alan J. Bielunis, Hampstead, NH (US)

(73) Assignee: Raytheon Company, Waltham, MA (US)

( * ) Notice: Subject to any disclaimer, the term of this patent is extended or adjusted under 35 U.S.C. 154(b) by 1239 days.

(21) Appl. No.: 10/871,995

(22) Filed: Jun. 18, 2004

(65) Prior Publication Data

US 2005/0279398 A1    Dec. 22, 2005

(51) Int. Cl.
     *G01K 17/02*    (2006.01)
     *G01K 7/00*    (2006.01)
     *G01J 5/00*    (2006.01)

(52) U.S. Cl. .................. 374/32; 374/179; 374/122; 136/225

(58) Field of Classification Search .............. 374/32, 374/122, 179
See application file for complete search history.

(56) References Cited

U.S. PATENT DOCUMENTS

| | | | |
|---|---|---|---|
| 2,432,199 A | 8/1945 | Kamm | |
| 3,091,965 A | 5/1960 | Strickland | |
| 3,517,555 A | 3/1968 | Strickland | |
| 3,908,164 A | 9/1975 | Parker | |
| 3,928,800 A | 12/1975 | Strenglein | |
| 4,936,144 A | 6/1990 | Djorup | |
| 5,302,024 A | 4/1994 | Blum | |
| 5,982,014 A | 11/1999 | Paige | |
| 6,107,210 A | 8/2000 | Gaitan et al. | |
| 6,384,787 B1 | 5/2002 | Kim et al. | |
| 6,677,654 B2 | 1/2004 | Kim et al. | |
| 2001/0035758 A1 | 11/2001 | Furukawa | |
| 2003/0076085 A1 | 4/2003 | Kodato | |
| 2003/0080725 A1* | 5/2003 | Kodato ..................... 324/95 |
| 2004/0057495 A1* | 3/2004 | Lee et al. .................. 374/122 |

FOREIGN PATENT DOCUMENTS

EP      54167961      12/1979

(Continued)

OTHER PUBLICATIONS

David M. Pozar. Design of Millimeter Wave Microstrip Reflectarrays, Feb. 1997, pp. 287-296. vol. 45, No. 2.

(Continued)

*Primary Examiner*—Gail Verbitsky
*Assistant Examiner*—Mirellys Jagan
(74) *Attorney, Agent, or Firm*—Daly, Crowley, Mofford & Durkee, LLP

(57) ABSTRACT

A power sensor having a microstrip transmission line, comprising: a dielectric substrate; a strip conductor disposed on one surface of the substrate; and a ground plane conductor disposed on an opposite surface of the substrate. The power sensor includes a plurality of thermocouples extending from the strip conductor, proximal end portions of the thermocouples being thermally coupled to the strip conductor. A plurality of electrical conductors is provided, each one having a first end electrically connected to a distal end of a corresponding one of the thermocouples and a second end electrically connected to the proximate end of one of the plurality of thermocouples disposed adjacent to such corresponding one of the thermocouples. The proximal ends of the thermocouples are electrically insulated one from the other.

34 Claims, 3 Drawing Sheets

FOREIGN PATENT DOCUMENTS

| EP | 0 720 022 A1 | 7/1996 |
|---|---|---|
| EP | 1 460 437 A1 | 3/2003 |
| JP | 60160185 A | 8/1985 |
| JP | 02 280065 A | 11/1990 |

OTHER PUBLICATIONS

S.D. Targonski, Analysis and Design of a Microstrip Reflectarray Using Patches of Variable Size, pp. 1820-1823, University of Massachusetts. Amherst, Massachusetts 01003.

Marek E. Bialkowski, Design, Development, and Testing of X-Band Amplifying Reflectarrays, Aug. 2002, pp. 1065-1076, vol. 50, No. 8.

Marek E. Bialkowski, Dual Linearly Polarized Reflect Array Using Aperture Coupled Microstrip Patches, 2001, pp. 486-489, HRL Laboratories, Malibu, CA 90265.

Coplanar Waveguides Supported by InGap and GaAs/AlGaAs Membrane-Like Bridges. 2002, pp. 1-3.

A. Dehe, GaAs Monolithic Integrated Microwave Power Sensor in Coplanar Waveguide Technology, 1996, pp. 179-182.

A. Dehe, GaAs Integrated Thermoelectric Microwave Power Sensor, 2004, pp. 1-3.

O. Blum, Promise and Progress of GaAs MEMS and MOEMS, 2001, pp. 1-4, Alburquerque, NM 87185.

A. Dehe, Hugh-sensitivity microwave power sensor for GaAs-MMIC implementation, Nov. 7, 1996, pp. 2149-2150, vol. 32, No. 23.

Search Report for Application No. PCT/US2004/036265 dated Mar. 4, 2005.

Jaeggi D. et al:"Thermoelectric AC Power Sensor by CMOS Technology" IEEE Electron Device Letters. IEEE Inc, New York, US vol. 13, No. 7, (Jul. 1, 1992), pp. 366-368.

A. Dehe et al, Integrated Microwave Power Sensor, Electronics Letters Dec. 7, 1995, vol. 31 No. 25 pp. 2187-2188.

A. Dehe et al, Broadband Thermoelectric Microwave Power Sensor usinhg GaAs Foundry Process, 2002 IEEE MTT-S Digest pp. 1829-1832.

Examination report dated Dec. 18, 2008, for European Patent Application No. 05757136.6, filed Dec. 5, 2006, 3 pages.

Mutamba et al. "Micromachined 60 GHz GaAs Power Sensor with Integrated Receiving Antenna" IEEE 2001 IEEE MTT-S 2001 pp. 2235-2238 vol. 3.

\* cited by examiner

MICROSTRIP POWER SENSOR

TECHNICAL FIELD

This invention relates to power sensors and more particularly to power sensors adapted to measure microwave power passing through a microwave transmission line.

BACKGROUND

As is known in the art, there is a need for high-sensitivity, small, linear power sensors without the use of complex, large circuits and external biasing. Sensors that are highly integrated with power amplifiers, for example, are useful at the input, output, and inter-stage networks to detect any inefficiency in the amplifier performance. These types of integrated power sensors may be used in a system that is tunable for optimal performance. Broad bandwidth is also a desirable feature for any system to detect spurious signals. The integrated microstrip-based power sensor with direct contact thermopiles solves these problems with small size, linearity, no external biasing, broadband operation (2-18 GHz tested), and improved sensitivity.

Field effect transistor (FET) mesas may be used to detect power passively without external bias. Planar transmission lines, such as microstrip, dissipate power in the form of heat as they propagate. This dissipated power is related to the insertion loss per unit length of the microstrip line given an initial input power value. If a heat absorbing material is placed in close proximity to the transmission line, the dissipated power will heat the material. By isolating the heat absorbing material so that it is cool furthest from the RF transmission line, a temperature differential builds across it. Certain material combinations, called thermocouples, respond to this thermal gradient with a detectable voltage gradient and convey information about the input power from the RF microstrip line. It is based on the Seebeck effect (measured in volts per degree C.) in which a voltage appears between two dissimilar materials if a temperature gradient exists between two junctions along them. This approach is highly integrated and does not require couplers. Lossy transmission line is the source of ohmic loss, or heat. These thermocouple fingers are connected in series to create a thermopile with increased sensitivity. The thermopiles are placed on both sides of the transmission line and the total sensitivity is equal to the total voltage detected over the power dissipated in V/W. Increased sensitivity can be obtained with improved thermal isolation of the hot junction by micromachining or locally etching the bulk GaAs substrate under the center conductor and hot junctions. Other parameters employed to increase sensitivity are: the number of thermopiles, thermopile length, thermopile width, thermopile pitch, and proximity to heat source.

As shown in the equations below, the sum of the temperature differentials ($T_i$, $T_o$) between the hot and cold junctions for a series of thermocouples is multiplied by the Seebeck coefficient ($\alpha_k$) to yield a detected voltage ($V_{out}$) for the thermopile. The sensitivity (S) is equal to the detected voltage divided over the power dissipated.

Seebeck, $\alpha_{tc} \sim 300\ \mu V/C$ $$V_{out} = \alpha_{tc} \sum_{i=1}^{N} (T_i - T_o)$$

Sensitivity, $S = V_{out}/P_{diss}$, (V/W)

To determine the dissipated power, electromagnetic simulations such as Momentum and HFSS are used to determine the insertion loss as a function of frequency, and then the dissipated power is calculated as follows. For example, following the equations below, if an input power of 2 W is applied to a line with 0.5 dB of insertion loss, the dissipated power level will be 0.22 W.

InsertionLoss(dB)=10 log Pin/Pout

Pout=Pin/($10^{(InsertionLoss/10)}$)

Pdissipated=Pin−Pout

Pdissipated=Pin−Pin/($10^{(InsertionLoss/10)}$)

Reference is made to the following articles: "Broadband thermoelectric microwave power sensors using GaAs foundry process" by Dehe, A.; Fricke-Neuderth, K.; Krozer, V.; "Microwave Symposium Digest, 2002 IEEE "MTT-S International, Volume: 3, 2002 Page(s): 1829-1832; "Free-standing $Al_{0.30}Ga_{0.70}As$ thermopile infrared sensor", by Dehe, A.; Hartnagel, H. L.; Device Research Conference, 1995. Digest. 1995 53rd Annual, 19-21 Jun. 1995 Page(s): 120-12; and "High-sensitivity microwave power sensor for GaAs-MMIC implementation" by Dehe, A.; Krozer, V.; Chen, B.; Hartnagel, H. L.; Electronics Letters, Volume: 32 Issue: 23, 7 Nov. 1996 Page(s): 2149-215.

One such type of power sensor is described in an article by A. Dehe et al., entitled "GaAs Monolithic Integrated Microwave Power Sensor in Coplanar Waveguide Technology" published in the IEEE 1996 Microwave and Milli-meter Wave Monolithic Circuits Symposium, pages 179-181. In such article, the authors show a power senor having sensitivity levels of 0.55 V/W with coplanar waveguide using AlGaAs mesa for a terminated load of 50 Ohms. In some applications, it would be desirable to obtain a power sensor having a higher level of sensitivity.

SUMMARY

In accordance with the present invention, a power sensor is provided having a microstrip transmission line, comprising: a dielectric substrate; a strip conductor disposed on one surface of the substrate; and a ground plane conductor disposed on an opposite surface of the substrate. The power sensor includes a plurality of thermocouples extending from the strip conductor, proximal end portions of the thermocouples being thermally coupled to the strip conductor.

In one embodiment, the power sensor includes a plurality of electrical conductors, each one having a first end electrically connected to a distal end of a corresponding one of the thermocouples and a second end electrically connected to the proximate end of one of the plurality of thermocouples disposed adjacent to such corresponding one of the thermocouples. The proximal ends of the thermocouples are electrically insulated one from the other.

In one embodiment, the substrate comprises III-V material.

In one embodiment, the substrate comprises GaAs.

In one embodiment, the thermocouples comprise III-V material.

In one embodiment, the thermocouples comprise GaAs.

In one embodiment, the thermocouples are mesas on the substrate.

In one embodiment, the plurality of thermocouples extend perpendicular from the strip conductor.

In one embodiment, the proximal end portions of the thermocouples are disposed in an overlying relationship with the edge portions of the strip conductor.

In one embodiment, the proximal end portions of the thermocouples are disposed on and thermally coupled to the strip conductor.

In accordance with another feature of the invention, a method is provided for forming a power sensor. The method includes: providing a semi-insulating single crystal substrate; forming a plurality of mesas thermocouples on a surface of the substrate, such mesas being single crystal material; forming a strip conductor with edge portions thereof on proximate end portions of the thermocouples, such thermocouples extending outwardly from the strip conductor; forming an insulating layer on the strip conductor; forming a plurality of electrical conductors, each one having a first end disposed on and electrically connected to a distal end of a corresponding one of the thermocouples and a second end disposed on and electrically connected to the proximate end of one of the plurality of thermocouples disposed adjacent to such corresponding one of the thermocouples, such plurality of electrical conductors being electrically insulated one from the other and from the strip conductor by the insulating layer; and providing a ground conductor on an opposite surface of the substrate, such strip conductor, substrate and ground plane conductor forming a microstrip transmission line.

In this invention, three modifications (i.e., hot junction of thermocouples placed directly underneath the center conductor; a metamorphic high electron mobility transistor (MHEMT) mesa used to create thermocouples; and, microstrip-based sensor) improve the sensitivity of the power sensor. First, microstrip line is used rather than coplanar waveguide. More importantly for sensitivity, the mesa utilized is a (MHEMT) structure and lastly the hot junctions of each of the thermopiles are placed directly under the microstrip line rather than adjacent to the line. Models show that this additional proximity to the center conductor, the source of heat from dissipated power in the circuit, makes the most substantial improvement in sensitivity.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
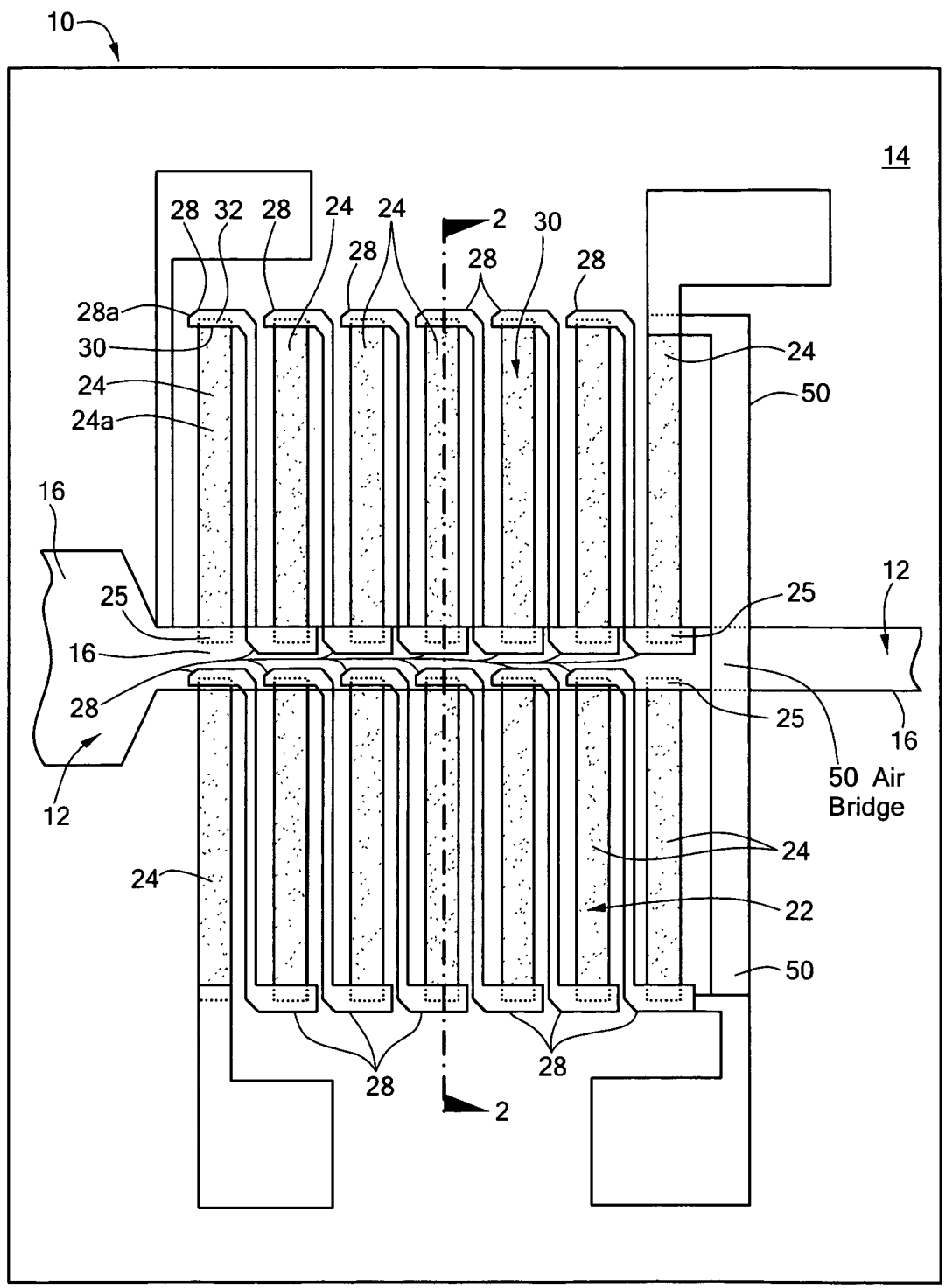
FIG. 1 is a plan view sketch of a power sensor according to the invention.
Figure 2:
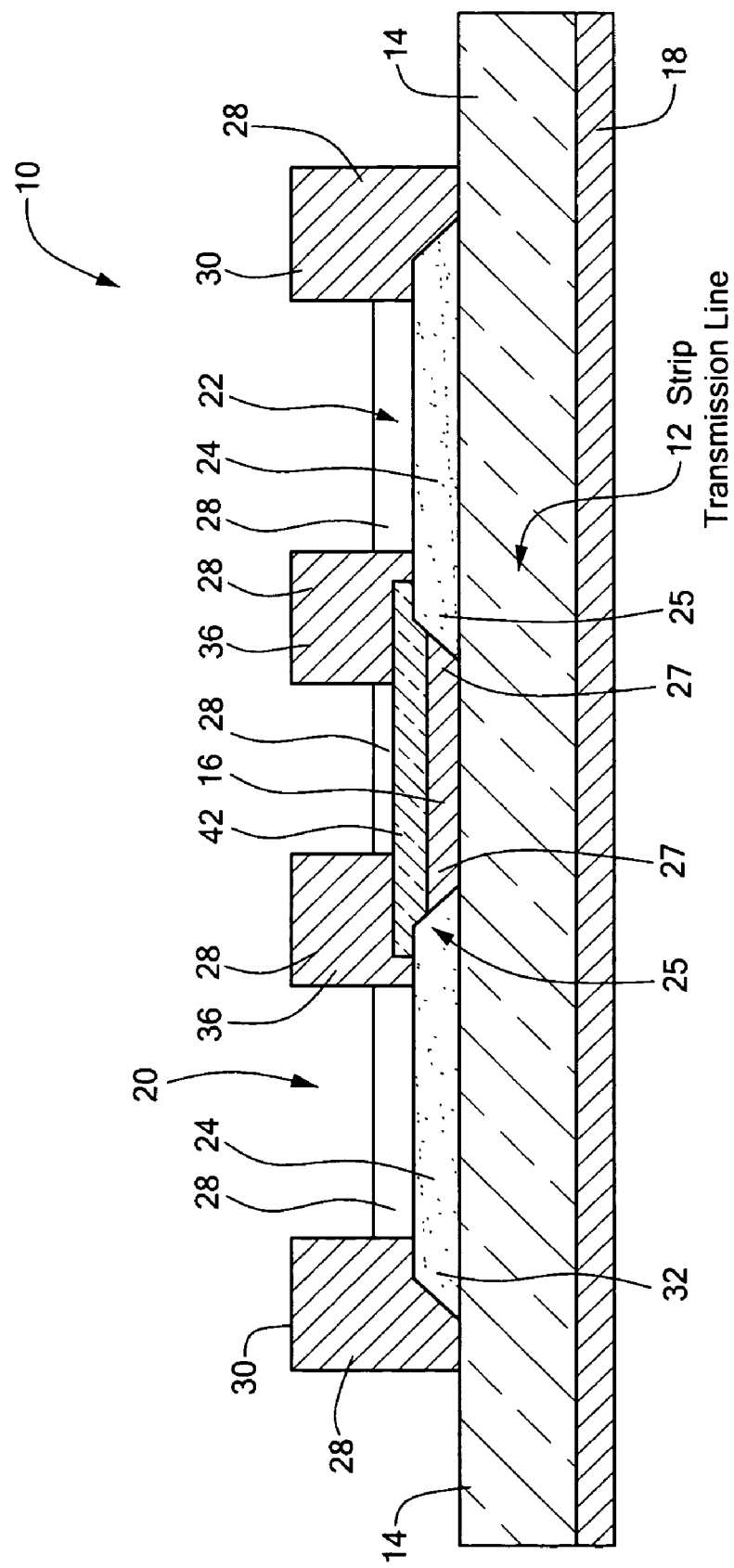
FIG. 2 is a cross-sectional view of the power sensor of FIG. 1, such cross section being taken along line-2-2 of FIG. 1.

Referring now to FIGS. 1 and 2, a power sensor 10 includes a microstrip transmission line 12, comprising: a dielectric substrate 14; a strip conductor 16 disposed on one surface, here the upper surface of the substrate 14; and a ground plane conductor 18 (FIG. 2) disposed on an opposite, here back, or lower, surface of the substrate 14.

The power sensor 10 includes a pair of identical thermopiles 20, 22. Each one of the thermopiles 20, 22 is on the same, here upper surface of the substrate 14 and on opposite sides (upper and lower sides in FIG. 1, left and right sides in FIG. 2) of the strip conductor 16. Each one of the thermopiles 20, 22 includes a plurality of, here seven, elongated, finger-like thermocouples 24 extending from the strip conductor 16, proximal end portions 25 (shown more clearly in FIG. 2) of the thermocouples 24 being thermally coupled to the edge portions 27 of the strip conductor 16.

Each one of the thermopiles 20, 22 include a plurality, here six, electrically insulated of S-shaped electrical conductors 28, each one having a first end 30 electrically connected to a distal end 32 of a corresponding one of the thermocouples 24 and a second end 36 electrically connected to the proximal end portion 25 of one of the plurality of thermocouples 24 disposed adjacent to such corresponding one of the thermocouples 24, as shown more clearly in FIG. 2. The proximal ends 25 of the thermocouples 24 are electrically insulated one from the other by an insulating layer 42 (FIG. 2). The equivalent electrical circuit of the sensor 10 is shown in FIG. 3.

Figure 3:
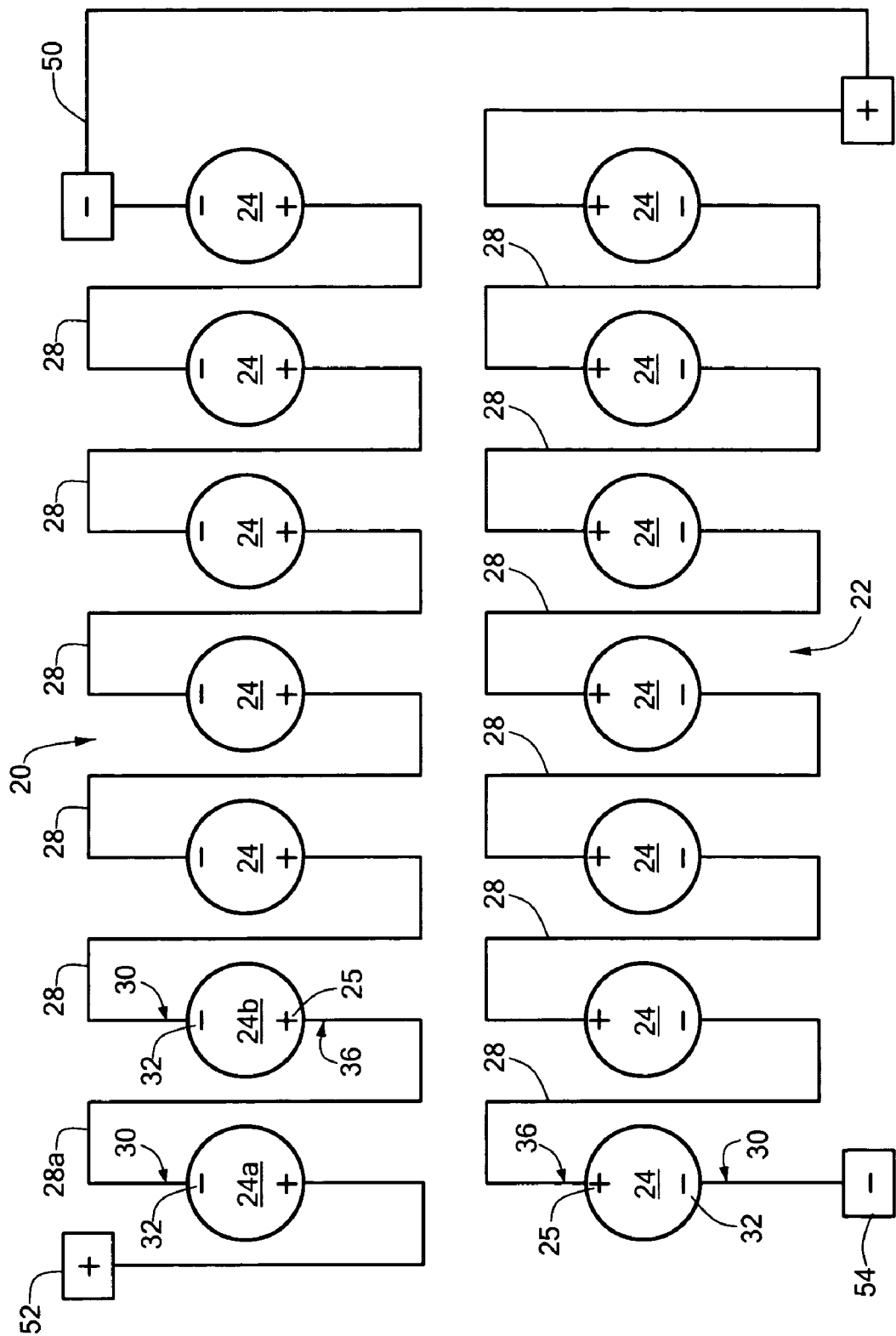
FIG. 3 is a schematic diagram of the power sensor of FIGS. 1 and 2.

Thus, as shown in FIG. 3, and considering the thermopile 20, a first one of the thermopiles 24, here labeled 24a has distal end 32 thereof electrically connected to first end 30 of one of the S-shaped electrical conductor 28, here labeled 28a. The second end 36 of the electrical conductor 28a is electrically connected to the proximal end 25 of the adjacent one of the thermocouples 24, here labeled 24b. It is noted that each thermocouple 28 produces a voltage V in response to the temperature difference across it, such temperature difference being related to the amount of RF power passing through the strip transmissions line 12 (FIGS. 1 and 2). It is noted that the polarity of the voltage V is the same at the distal ends 32 of the thermopiles 28 is opposite (here labeled+) to the polarity (here labeled−) of the voltage V at the proximal ends 25 of the thermopiles 28, as shown in FIG. 3. The electrical conductors thereof serially connect the voltages V produced by the individual thermopiles 20, 22. The serially connected voltages of the two thermopiles 20, 22 are themselves serially connected by electrical conductor 50, such conductor 50 being formed as an air-bride over the strip conductor 16, as shown in FIG. 1. The total voltage, her 14 times V, appears at pads 52, 54, pad 52.

Here, the substrate 14 (FIG. 2) is a single crystal, III-V material, here GaAs. The thermopiles comprise GaAs material having epitaxial layers, not shown. Here, the thermocouples 14 are mesas on the substrate 14 and extend perpendicular from the strip conductor 16. Here, referring to FIG. 2, the proximal end portions 25 of the thermocouples 28 are disposed in an overlying relationship with the edge portions 27 of the strip conductor 16. More particularly, here the proximal end portions 25 of the thermocouples are disposed under, and are thermally coupled, to the strip conductor 27.

The power sensor 10 is here formed by the following method. The semi-insulating single crystal substrate 10 is provided. A plurality of GaAs mesas is formed on a surface of the substrate to provide the thermocouples 24. The strip conductor 16 is disposed on the surface of the structure and is then patterned with edge portions 27 thereof disposed on proximate end portions 25 of the thermocouples 24. As noted above, the thermocouples 24 extend outwardly from (here perpendicular to) the strip conductor 16. The insulating layer 42 is disposed and patterned to be disposed over the surface on the strip conductor 16. It is noted that the patterning exposes edge portions of the thermocouples 24 (i.e., the portions of the thermocouples 24 adjacent to the proximal ends 25 and distal ends 32 thereof, as shown in FIG. 2).

The plurality of electrical conductors 28 is formed, each one having the first end 28 disposed on, and electrically connected, the distal end 32 of a corresponding one of the thermocouples 24 and a second end 36 disposed on, and electrically connected to, the proximate end 25 of one of the plurality of thermocouples 24 disposed adjacent to such corresponding one of the thermocouples 24 as described above in connection with FIG. 3 and exemplary thermocouples 24a, 24b. The plurality of electrical conductors 28 are electrically insulated one from the other and from the strip conductor 16 by the insulating layer 16 (FIG. 2). It is noted that the ground conductor 18 (FIG. 2) is provided on an opposite surface of the substrate 14, such strip conductor 16, substrate 14 and ground plane conductor 18 forming the microstrip transmission line 12. It is noted that the ground plane conductor 18 may be formed prior to, or subsequent to, the formation of the mesa thermocouples 24.

The above-described thermopile-based power sensor was designed, modeled, fabricated, and tested on a MHEMT structure with the hot junction fingers directly underneath the center (i.e., strip) conductor. Also shown is the typical performance in non-micromachined terminated microstrip thermopiles. For the two different designs, measurements at 2, 10 and 18 GHz with input drives ranging from –15 dBm to +20 dBm yield linear responses and sensitivity levels up to 1 V/W.

The power sensor uses microstrip transmission line in which the thermocouples are not just placed in close proximity to the microstrip transmission line but directly underneath it for maximum heat absorption. Without micromachining, or locally etching the GaAs substrate for improved thermal isolation, measured results from this invention are as much as 1.1 V/W while previous results reported were ~0.55 V/W. Micromachining will of course improve the sensitivity even further, although improving the sensitivity without micromachining as shown in this invention allows for simplest fabrication and a fully robust substrate.

The integrated microstrip-based power sensor with direct contact thermopiles solves these problems with small size, linearity, no external biasing, broadband operation (2-18 GHz tested), and improved sensitivity. To achieve higher sensitivity levels (2 V/W), local areas of GaAs were etched or micromachined underneath the hot junction to provide better thermal isolation.

A number of embodiments of the invention have been described. Nevertheless, it will be understood that various modifications may be made without departing from the spirit and scope of the invention. Accordingly, other embodiments are within the scope of the following claims.

What is claimed is:

1. A power sensor, comprising:
   (a) a microwave transmission line, comprising:
      (i) a dielectric substrate;
      (ii) a strip conductor disposed on one surface of the substrate; and
      (iii) a ground plane conductor disposed on the substrate;
   (b) a plurality of adjacent, mesa shaped, thermocouples extending outwardly from the strip conductor, proximal end portions of the thermocouples having sloping sidewalls, and edge portions of the strip conductor being disposed in an overlying relationship and being thermally coupled to the sloping sidewalls of the thermocouples.

2. The power sensor recited in claim 1 wherein the transmission line is a microstrip transmission line wherein the strip conductor is disposed over said surface of the substrate and the ground plane is disposed under the strip conductor under an opposite surface of the substrate.

3. The power sensor recited in claim 2 including a plurality of electrical conductors, each one having a first end electrically connected to a distal end portion of a corresponding one of the thermocouples and a second end electrically connected to the proximate end portion of one of the plurality of thermocouples disposed adjacent to such corresponding one of the thermocouples.

4. The power sensor recited in claim 3 wherein the proximal end portions of the thermocouples are electrically insulated one from the other.

5. The power sensor recited in claim 1 including a plurality of electrical conductors, each one having a first end electrically connected to a distal end of a corresponding one of the thermocouples and a second end electrically connected to the proximate end portions of one of the plurality of thermocouples disposed adjacent to such corresponding one of the thermocouples.

6. The power sensor recited in claim 5 wherein the proximal end portions of the thermocouples are electrically insulated one from the other.

7. The power sensor recited in claim 6 wherein the substrate comprises III-V material.

8. The power sensor recited in claim 7 wherein the substrate comprises GaAs.

9. The power sensor recited in claim 8 wherein the thermocouples comprise III-V material.

10. The power sensor recited in claim 9 wherein the thermocouples comprise GaAs.

11. The power sensor recited in claim 10 wherein the thermocouples are mesas on the substrate.

12. The power sensor recited in claim 11 wherein the plurality of thermocouples extend perpendicular from the strip conductor.

13. A power sensor, comprising:
    (a) a microwave transmission line, comprising:
       (i) a dielectric substrate;
       (ii) a strip conductor disposed on one surface of the substrate; and
       (iii) a ground plane conductor disposed on the substrate;
    (b) a plurality of adjacent, mesa shaped thermocouples extending outwardly from edge portions of the strip conductor, proximal end portions of the thermocouples having sloping sidewalls and edge portions of the strip conductor being disposed in an overlying relationship with sloping sidewalls of the thermocouples.

14. The power sensor recited in claim 13 wherein the transmission line is a microstrip transmission line wherein the strip conductor is disposed over said surface of the substrate and the ground plane is disposed under the strip conductor under an opposite surface of the substrate.

15. The power sensor recited in claim 14 including a plurality of electrical conductors, each one having a first end electrically connected to the distal end portion of a corresponding one of the thermocouples and a second end electrically connected to the proximate end portion of one of the plurality of thermocouples disposed adjacent to such corresponding one of the thermocouples.

16. The power sensor recited in claim 15 wherein the proximal end portions of the thermocouples are electrically insulated one from the other.

17. The power sensor recited in claim 13 including a plurality of electrical conductors, each one having a first end electrically connected to the distal end portion of a corresponding one of the thermocouples and a second end electrically connected to the proximate end portion of one of the plurality of thermocouples disposed adjacent to such corresponding one of the thermocouples.

18. The power sensor recited in claim 17 wherein the proximal end portions of the thermocouples are electrically insulated one from the other.

19. The power sensor recited in claim 18 wherein the substrate comprises III-V material.

20. The power sensor recited in claim 19 wherein the substrate comprises GaAs.

21. The power sensor recited in claim 20 wherein the thermocouples comprise III-V material.

22. The power sensor recited in claim 21 wherein the thermocouples comprise GaAs.

23. The power sensor recited in claim 22 wherein the thermocouples are mesas on the substrate.

24. The power sensor recited in claim 23 wherein the plurality of thermocouples extend perpendicular from the edge portions of the strip conductor.

25. A power sensor, comprising:
 (a) a microwave transmission line, comprising:
  (i) a dielectric substrate;
  (ii) a strip conductor disposed on one surface of the substrate; and
  (iii) a ground plane conductor disposed on an opposite surface of the the substrate;
 (b) a plurality of thermocouples mesa shaped extending outwardly from the strip conductor, proximal end portions of the thermocouples and edge portions of the strip conductor being disposed in an overlying relationship and being disposed on and thermally coupled to the sloping sidewalls of the thermocouples.

26. The power sensor recited in claim 25 wherein the transmission line is a microstrip transmission line wherein the strip conductor is disposed over said surface of the substrate and the ground plane is disposed under the strip conductor under an opposite surface of the substrate.

27. The power sensor recited in claim 26 including a plurality of electrical conductors, each one having a first end electrically connected to the distal end portion of a corresponding one of the thermocouples and a second end electrically connected to the proximate end portion of one of the plurality of thermocouples disposed adjacent to such corresponding one of the thermocouples.

28. The power sensor recited in claim 27 wherein the proximal end portions of the thermocouples are electrically insulated one from the other.

29. The power sensor recited in claim 25 including a plurality of electrical conductors, each one having a first end electrically connected to the distal end portions of a corresponding one of the thermocouples and a second end electrically connected to the proximate end portions of one of the plurality of thermocouples disposed adjacent to such corresponding one of the thermocouples.

30. The power sensor recited in claim 29 wherein the proximal end portions of the thermocouples are electrically insulated one from the other.

31. The power sensor recited in claim 30 wherein the proximal end portions of the thermocouples are disposed on and thermally coupled to edge portions of the strip conductor.

32. The power sensor recited in claim 31 wherein the thermocouples are mesas on the substrate.

33. The power sensor recited in claim 32 wherein the plurality of thermocouples extend perpendicular from the edge portions of the strip conductor.

34. A method for forming a power sensor, comprising:
 providing a semi-insulating single crystal substrate;
 forming a plurality of mesas thermocouples on a surface of the substrate, such mesas being single crystal material;
 forming a strip conductor with edge portions thereof on sloping sidewalls at proximate end portions of the thermocouples, such thermocouples extending outwardly from the strip conductor;
 forming an insulating layer on the strip conductor;
 forming a plurality of electrical conductors, each one having a first end disposed on and electrically connected to a distal end portion of a corresponding one of the thermocouples and a second end disposed on and electrically connected to the proximate end portion of one of the plurality of thermocouples disposed adjacent to such corresponding one of the thermocouples, such plurality of electrical conductors being electrically insulated one from the other and from the strip conductor by the insulating layer; and
 providing a ground conductor on the substrate, such strip conductor, substrate and ground plane conductor forming a transmission line.

* * * * *

UNITED STATES PATENT AND TRADEMARK OFFICE
CERTIFICATE OF CORRECTION

PATENT NO. : 7,670,045 B2  Page 1 of 1
APPLICATION NO. : 10/871995
DATED : March 2, 2010
INVENTOR(S) : Katherine J. Herrick et al.

It is certified that error appears in the above-identified patent and that said Letters Patent is hereby corrected as shown below:

Column 3, line 17 delete "mesas" and replace with --mesa--.

Column 3, line 37-38 delete "micros-trip-based" and replace with --micro-strip-based--.

Column 3, line 39 delete "microstrip" and replace with --a microstrip--.

Column 4, line 38 delete "28 is" and replace with --28 and is--.

Column 4, line 46 delete "her" and replace with --here--.

Column 4, line 45-47 delete "52, 54, pad 52." and replace with --52, 54.--.

Column 4, line 57 delete "27" and replace with --16--.

Column 5, line 4 delete "FIG. 2." and replace with --FIG. 2).--.

Signed and Sealed this

Twenty-eighth Day of September, 2010

David J. Kappos
*Director of the United States Patent and Trademark Office*